US010079033B1

(12) United States Patent
Oberg

(10) Patent No.: US 10,079,033 B1
(45) Date of Patent: Sep. 18, 2018

(54) WRITE STRATEGY IMPROVEMENTS FOR READ CHANNEL AND PRE-AMP

(71) Applicant: Marvell International Ltd., Hamilton (BM)

(72) Inventor: Mats Oberg, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/880,395

(22) Filed: Jan. 25, 2018

Related U.S. Application Data

(60) Provisional application No. 62/451,249, filed on Jan. 27, 2017.

(51) Int. Cl.
| | |
|---|---|
| *G11B 5/02* | (2006.01) |
| *G11B 5/09* | (2006.01) |
| *G11B 5/48* | (2006.01) |
| *G11C 7/10* | (2006.01) |
| *G11C 7/12* | (2006.01) |

(52) U.S. Cl.
CPC .............. *G11B 5/09* (2013.01); *G11B 5/4806* (2013.01); *G11C 7/1096* (2013.01); *G11C 7/12* (2013.01)

(58) Field of Classification Search
CPC . G11B 20/10009; G11B 5/09; G11B 2220/90; G11B 5/012; G11B 5/02; G11B 15/125; G11B 15/02; G11B 7/126; G11B 7/0045; G11B 7/1263; G11B 7/131; G11B 7/127
USPC ........ 369/120, 121, 116; 360/39, 40, 46, 55, 360/62
See application file for complete search history.

(56) References Cited

U.S. PATENT DOCUMENTS

| | | | |
|---|---|---|---|
| 7,372,649 B2 * | 5/2008 | VanEaton | ................ G11B 5/02 327/108 |
| 7,583,459 B1 | 9/2009 | Cheng | |
| 7,880,986 B1 | 2/2011 | Cheng | |
| 8,358,478 B1 | 1/2013 | Cheng | |
| 8,693,117 B1 | 4/2014 | Cheng | |
| 9,030,770 B2 | 5/2015 | Contreras et al. | |

(Continued)

OTHER PUBLICATIONS

Contreras et al., "Characterization of Write-Signal Efficiency Utilizing Write-Current Dynamic Wave-Shaping", IEEE Transactions on Magnetics, vol. 53, No. 2, Feb. 2017, 7 pages.

*Primary Examiner* — Nabil Hindi

(57) ABSTRACT

Systems and techniques for compensation to improve write signal controls for magnetic-medium-based storage devices, include an apparatus comprising: pre-compensation circuitry coupled with a controller to receive a data signal and a write-current control signal and to generate a write-current signal; the pre-compensation circuitry is configured to use different baseline write-current levels for the write-current signal after an overshoot write-current level used at polarity transitions of the write-current signal, and the pre-compensation circuitry is configured use a first baseline level of the different baseline write-current levels for a first type of magnet in the sequence of magnets and use a second baseline level of the different baseline write-current levels for a second type of magnet in the sequence of magnets, the first baseline level having a greater magnitude than the second baseline level, and the first type of magnet being shorter than the second type of magnet.

14 Claims, 4 Drawing Sheets

(56) References Cited

U.S. PATENT DOCUMENTS 9,431,052 B2    8/2016   Oberg et al.
9,728,221 B2    8/2017   Oberg et al.

* cited by examiner

WRITE STRATEGY IMPROVEMENTS FOR READ CHANNEL AND PRE-AMP

CROSS-REFERENCE TO RELATED APPLICATIONS

This disclosure claims priority to U.S. Provisional Application Ser. No. 62/451,249, filed on Jan. 27, 2017, and entitled "WRITE STRATEGY IMPROVEMENTS FOR READ CHANNEL AND PRE-AMP", which is incorporated herein by reference.

BACKGROUND

This disclosure relates to compensation techniques to improve write signal controls for magnetic-medium-based storage devices, such as Hard Disk Drives (HDD), and circuitry used therein.

Hard Disk Drives (HDD) are ubiquitous in the computing environment. Existing HDD systems employ magnetic-medium-based storage devices, and the data is typically stored on circular, concentric tracks on magnetic disk surfaces. A read/write head retrieves and records data on the magnetic layer of a rotating disk as it flies on a cushion of air over the disk surface. When retrieving data, magnetic field variations are converted into an analog electrical signal, the analog signal is typically amplified, converted to a digital signal and interpreted. When writing to the track, the disk is rotated at a predetermined speed, and electrical signals applied to a magnetic read/write head floating over the track are converted to magnetic transitions on the track.

The magnetic transitions on the track represent digital data encoded so that each transition may correspond to a ONE bit value and the absence of a transition may correspond to a ZERO bit value as in a "non-return to zero" (NRZ) encoding. Multiple magnetic fields having a corresponding polarity can be transferred onto the track by the read/write head, thereby forming magnets. Magnets can be generally described as respective regions (or sectors) of the recording medium including magnetic grains having a magnetic field transferred thereto. Each magnet (i.e., each region of magnetic field variation in the recording medium) has a particular polarity, and an associated width.

In some cases, writing involves a high frequency bit, which can also cause the formed magnet to have a shorter length. The short magnet may require an additional amount of time for the magnetic field to spread out in the written track. However, in some instances, shortly after forming the short magnet, the read/write head might quickly switch the polarity applied to the recording medium in order to record the next bit. Thus, due to this quick magnetic transition, not enough time is allowed for the shorter magnet to widen in the grain of the recording medium. Accordingly, short magnets can be typically characterized as having a small width. In the case of longer magnets, the duration between transitions allows for the magnetic field to spread within the track. Consequently, longer magnets tend to have a wider width than shorter magnets. Although wider magnets can be associated with various benefits, such as a stronger readback signal (e.g., higher signal-to-noise ratio), wider magnets have the potential drawback of interfering with the magnetic field of a neighboring track.

SUMMARY

This disclosure relates to compensation techniques to improve write signal controls for magnetic-medium-based storage devices, such as Hard Disk Drives (HDD), and circuitry used therein.

The techniques and systems described herein can facilitate the implementation of write pre-compensation (WPC) and write-current pre-compensation (WCPC) used in read/write channel circuitry.

According to an aspect of the described systems and techniques, an apparatus includes: a controller configured to generate a data signal and a write-current control signal for writing data to a magnetic medium of a data storage device as a sequence of magnets formed in the magnetic medium of the data storage device; and pre-compensation circuitry coupled with the controller to receive the data signal and the write-current control signal and to generate a write-current signal to effect the writing of the data to the magnetic medium based on the data signal and the write-current control signal; wherein the pre-compensation circuitry is configured to use different baseline write-current levels for the write-current signal after an overshoot write-current level used at polarity transitions of the write-current signal, and the pre-compensation circuitry is configured use a first baseline level of the different baseline write-current levels for a first type of magnet in the sequence of magnets and use a second baseline level of the different baseline write-current levels for a second type of magnet in the sequence of magnets, the first baseline level having a greater magnitude than the second baseline level, and the first type of magnet being shorter than the second type of magnet.

According to an aspect of the described systems and techniques, a disk drive system, includes: at least one magnetic media disk; a read/write head configured and arranged to write data to the magnetic media disk as a sequence of magnets formed in the magnetic media disk; pre-compensation circuitry coupled with the read/write head and configured to generate a write-current signal to effect writing of the data by the read/write head based on a data signal and a write-current control signal; and a controller coupled with the pre-compensation circuitry and configured to generate the data signal and the write-current control signal; wherein the pre-compensation circuitry is configured to use different baseline write-current levels for the write-current signal after an overshoot write-current level used at polarity transitions of the write-current signal, and the pre-compensation circuitry is configured use a first baseline level of the different baseline write-current levels for a first type of magnet in the sequence of magnets and use a second baseline level of the different baseline write-current levels for a second type of magnet in the sequence of magnets, the first baseline level having a greater magnitude than the second baseline level, and the first type of magnet being shorter than the second type of magnet.

The described systems and techniques can result in one or more of the following advantages. Compensation techniques can achieve optimized and improved write controls that account for variable magnet widths and magnetic transition shift, in order to reduce the impact of various electromagnetic characteristics that can degrade the data being recorded onto the magnetic recording medium. Consequently, the disclosed systems and techniques can improve overall performance and accuracy of the writing process for an HDD. Write-current pre-compensation (WCPC) techniques can involve appropriately adjusting write-current controls to realize uniformity amongst magnet widths, thus allowing tracks to be more closely packed together without an undue increase in cross-track interference during readback. The disclosed system leverages capabilities and resources of the read/write channel to implement aspects of the compensation techniques. Additionally, techniques use channel logic and controls to allow the pre-amplifier and channel interface to work in tandem with the read/write channel to support additional signaling and write-current controls. Accordingly, the disclosed techniques can provide write compensation, write-current compensation, and improved write-current control, without requiring additional hardware elements be added to the HDD device.

BRIEF DESCRIPTION OF THE DRAWINGS

Like reference symbols in the various drawings indicate like elements.

Certain illustrative aspects of the disclosed technologies are described herein in connection with the following description and the accompanying figures. These aspects are, however, indicative of but a few of the various ways in which the principles of the disclosed technologies may be employed and the disclosed technologies are intended to include all such aspects and their equivalents. Other advantages and novel features of the disclosed technologies may become apparent from the following detailed description when considered in conjunction with the figures.

DETAILED DESCRIPTION

The systems and techniques described herein can be implemented as one or more devices, such as one or more integrated circuit (IC) devices, in a storage device. For example, the system can be implemented in a read/write channel circuitry suitable for use in a magnetic recording system.

Figure 1:
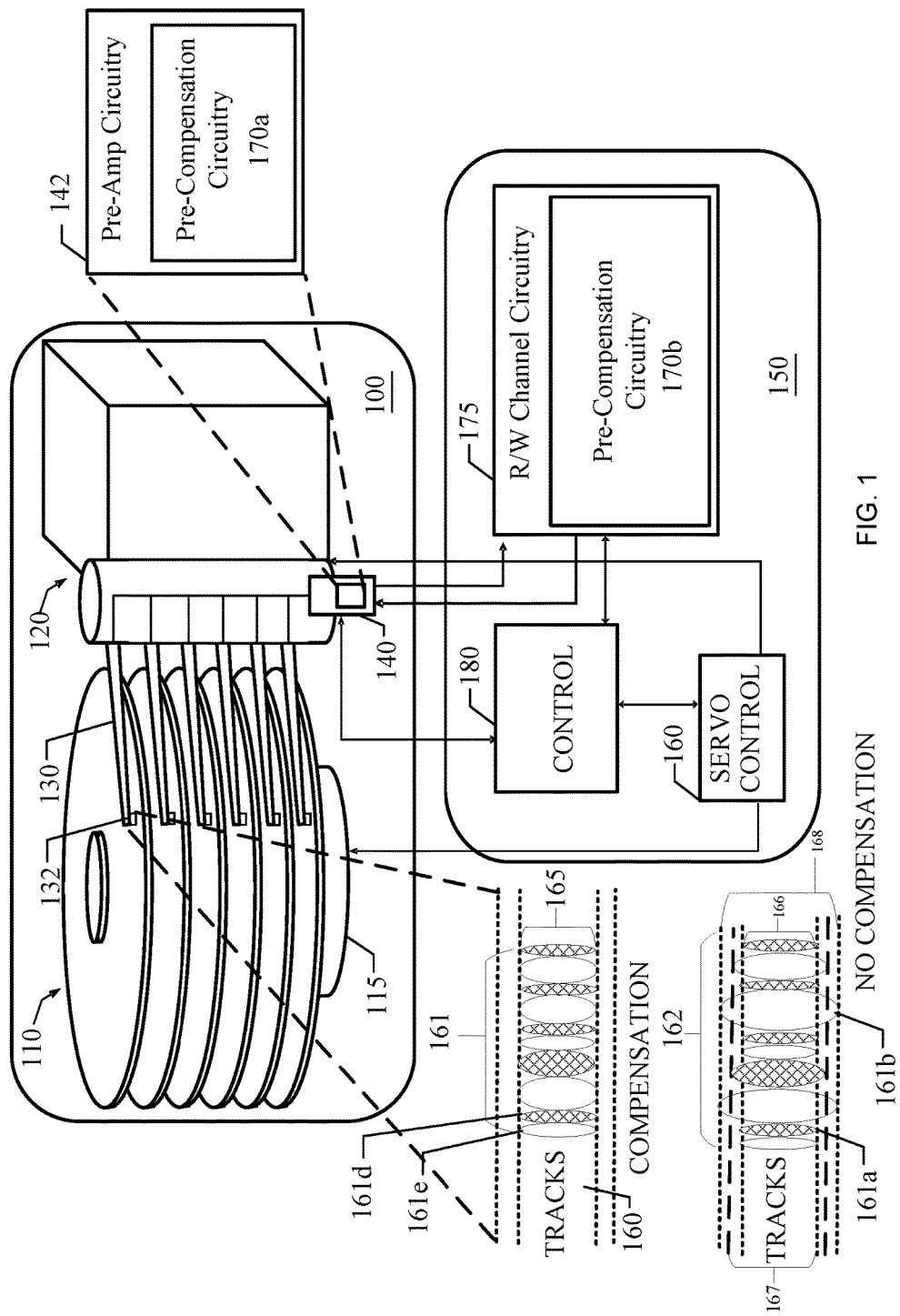
FIG. 1 shows an example of hard disk drive (HDD) architecture including pre-compensation aspects in read/write channel circuitry and pre-amplifier (pre-amp) circuitry.

FIG. 1 is a block diagram showing an example hard disk drive (HDD), or magnetic-medium-based storage device, including pre-compensation circuitry 170a, 170b as described herein. As shown in FIG. 1, the disk drive includes a head-disk assembly (HDA) 100 and drive electronics 150 (e.g., a printed circuit board assembly (PCBA) with semiconductor devices). The HDA 100 includes one or more disks 110 mounted on an integrated spindle and motor assembly 115. The spindle and motor assembly 115 rotates the disk(s) 110 under read/write head(s) 132 connected with a head assembly 120 in the HDA 100. The disk(s) 110 can be coated with a magnetically hard material (e.g., a particulate surface or a thin-film surface) and can be written to, or read from, a single side or both sides.

An arm 130 can maneuver, and thus position its read/write head(s) 132 over a desired track 160. In various implementations, the read/write head(s) 132 can include various numbers of head elements with combined or dedicated functions. For example, the read/write head(s) 132 can include one or more readers and one writer. As another example, the read/write head(s) 132 can include a dedicated write head and two or more separate, additional dedicated read heads. Moreover, although multiple arms 130 are shown in FIG. 1, in some implementations a single arm 130 (or other structures) can be used.

Signals between the HDA 100 and the drive electronics 150 can be carried through a flexible printed cable, for example. A controller 180 can direct a servo controller 160 to control mechanical operations, such as read/write head(s) 132 positioning through the head assembly 120 and rotational speed control through the motor assembly 115. The controller 180 can be one or more IC chips (e.g., a combo chip). The controller 180 can be a microprocessor and a hard disk controller. The drive electronics 150 can also include various interfaces, such as a host-bus interface, and memory devices.

The HDA 100 can include a pre-amp/writer 140, where head selection and sense current value(s) can be set. The pre-amp/writer 140 can amplify a read signal before outputting it to signal processing circuitry. Additionally, the pre-amp/writer 140 can include pre-amp circuitry 142 further having pre-compensation circuitry 170a. The pre-compensation circuitry 170a can be configured to function in concert with other components of the disk drive that are capable of performing pre-compensation. For example, the pre-compensation circuitry 170a can receive a WCPC signal from pre-compensation circuitry 170b, shown to be incorporated into the R/W channel circuitry 175. In this case, the pre-compensation circuitry 170a, 170b can communicate via an interface, such as an interface cable.

In response to receiving electrical signals from pre-compensation circuitry 170b, the pre-amp circuitry 142 is configured to generate, or otherwise control, a write-current supplied to the read/write head(s) 132. The write-current drives a read-write head 132, in accordance with compensation techniques, to write magnets 161 to disk(s) 110 such that the magnets 161 are essentially uniform in width. The pre-amp circuitry 142 can also perform various other write controls, including but not limited to; overshoot level, overshoot duration, write-current baseline level, rise/fall speeds for write transitions, and the like. Although FIG. 1 shows pre-compensation circuitry 170a, 170b as separate and dedicated circuitry, it should be appreciated that pre-compensation functions can be integrated into the existing microelectronics of the pre-amp circuitry 142 and/or the R/W channel circuitry 175.

At least one of the read/write head(s) 132 can be used to write one or more tracks 160 on disk(s) 110, where there are sectors for each of the tracks 160 (e.g., a sector of tracks 160). A disk 110 is shown to include tracks 160, for example after being written to by a read/write head 132. During write operations, the read/write head 132 is driven by a write-current, where the electrical signal is used to transfer magnetic fields having associated polarities to the disk 110.

The HDA 100 can be configured to perform write operations in accordance with various recording technologies, including but not limited to: perpendicular magnetic recording (PMR); shingled magnetic recording (SMR); heat-assisted magnetic recording (HAMR); microwave assisted magnetic recording (MAMR) and the like. As a result, the read/write head 132 forms a plurality of magnets 161 in the magnetic grains of the tracks 160. FIG. 1 illustrates, as a result of writing to the medium in accordance with the disclosed compensation techniques, that each of the magnets 161 can have the more uniform width 165. The width 165 for magnet 161 is a section of that medium that is taken up by the magnet, and having a distance relative to being perpendicular to the tracks 160. Magnets are also associated with a length, which is a distance parallel to the tracks 160 that the magnets occupy. Additionally, magnets 161 can have an associated depth, relating to a distance downwards into the grains of the tracks 160. As used hereinafter to describe magnets, narrow and wide refer to width, while long and short refer to length. The magnets 161 are shown as having a generally oval shape for purposes of illustration (in order to depict an associated width). However, it should be appreciated that magnets 161 are not necessarily formed in any particular shape in the magnetic grains of the written tracks 160 (where a magnet in this sense contains several grains).

Also, FIG. 1 illustrates the sequence of magnets 161 having alternating polarities. A polarity for each of the magnets 161 corresponds to the magnetic polarity applied by the read-write head 132 to the recoding medium in order to form the respective magnet 161. In FIG. 1, the magnets 161 having a first polarity 161*d* are indicated by the oval filled with a checkered pattern. The first polarity can correspond to encoding a bit, for example "0". The magnets 161 having a second polarity 161*e* are represented with ovals that are not filled. As an example, the first polarity can represent an encoded 0, while the opposing polarity encodes 1. Collectively, the formed magnets 161 can represent a data pattern to be written on to disk 110.

Additionally, FIG. 1 shows an example of magnets 162 that might be formed by a read-write head 132 without applying the disclosed compensation techniques. Prior to compensating for the effects of magnetic field dispersion within the grains, the system can anticipate that writing to the recording medium can form magnets having varying widths, shown as width$_1$ 166, width$_2$ 167, and width$_3$ 168 and illustrated in FIG. 1 using dashed lines. In the example, width$_1$ 166 is the smallest width, width$_2$ 167 is larger than width$_1$ 167, and width$_3$ 168 is larger than both width$_1$ 166 and width$_2$ 167. Accordingly, FIG. 1 shows multiple magnets 162 having a first width$_1$ 166 which is narrow. Some of the other types of magnets 162 shown have a larger width$_2$ 167, and an even larger width$_3$ 168. In addition, each of the magnets 162 are shown to have a corresponding polarity, illustrated as a first polarity 161*a* (e.g., checkered pattern), and a second polarity 161*b* (e.g., not filled) as discussed in detail above.

In some instances, writing bit patterns having a high-frequency (e.g., short bits) on the disk 110 can result in a first type of magnet that are shorter in length, which can be associated with narrow magnets. Conversely, low frequency data patterns (e.g., long bits) can form magnets of a second type that have comparatively longer lengths, which can be associated with wider magnets. Conceptually, longer magnets tend to be wider, and can potentially reach a current level that is too high during the length of time associated with writing longer bits to the disk(s) 100. Another scenario with wider magnets involves their interference on a neighboring track. As an example, each successive track 160 can be written to the recording medium with a track center at 50 nanometers (nm) apart. Track pitch, which can be described as the distance between adjacent tracks on the surface of the recording medium, in some existing HDD systems can be on the order of 50 nm. Nonetheless, track pitch can be reduced, as the recording density of a HDD increases. For example, SMR can have smaller track pitch. Track width can typically be the same as track pitch. Bit lengths can be in the order of 10 nm, or 2500 kilo bits per inch (kbpi), with a magnet 161 representing 1 or more bits of the same polarity (e.g., 0111110 with the ones in the middle being a magnet of length 5 bits).

Referring back to magnets 162 (formed without applying the disclosed compensation techniques) shown in FIG. 1, magnets 162 having width$_1$ 166, and magnets 162 having width$_2$ 167 can be less than 50 nm wide. Thus, narrow magnets 162 can fit within the 50 nm between tracks without causing interference to a previously written track. However, in the case of wider magnets, some wide magnets can be formed having widths that are even larger than the width of a track. For instance magnets 162 having width$_3$ 168 can be 60 nm (i.e., greater than the 50 nm distance between track centers), and subsequently those magnets can overwrite part of an adjacent magnet on a previously written track resulting in cross-track interference.

Moreover, shorter magnets can be associated with a shorter amount of time for transitioning, and potentially need a higher write-current baseline level and over-shoot amplitude (in comparison to longer magnets) for compensation. Accordingly, to address this, compensation techniques can manipulate electrical aspects in the write channel to effectuate a more uniform width, as shown amongst magnets 161 written to disk(s) 110.

As a general description, the pre-compensation circuitry 170*a*, 170*b* can implement techniques that adjust electrical signals to compensate for the varying widths of the magnets 162 by lowering a write-current for longer magnets. The pre-compensation circuitry 170*a*, 170*b* is configured to use different baseline write-current levels, where each level has a respective magnitude, for the write-current signal after an overshoot write-current level used at polarity transitions. As discussed in more detail in reference to FIG. 2, the pre-compensation circuitry 170*a*, 170*b* can generate an electrical signal that triggers whether to apply a first baseline write-current level having a greater magnitude for shorter magnets, or a second baseline level having a lesser magnitude for longer magnets. In some implementations, the same (or substantially the same) magnitude overshoot write-current level is used for transitions to all magnets, regardless of length. Alternatively, in some implementations, the pre-compensation circuitry 170*a*, 170*b* is configured to use a first overshoot write-current level, having a greater magnitude at polarity transitions for shorter magnets, and a second overshoot write-current level, having a lesser magnitude, at polarity transitions for longer magnets. Selection of the appropriate overshoot write-current level is also triggered by the electrical signal generated by the pre-compensation circuitry 170*a*, 170*b*.

The drive electronics 150 can include a subset of elements ascribed to it in various examples herein and/or other elements ascribed to the HDA 100. Thus, in some implementations, the drive electronics 150 can be one or more IC chips (e.g., a combo chip or system on chip (SOC)), which includes the R/W channel circuitry 175 having circuitry for implementing, at least in part, the disclosed compensation techniques.

The drive electronics 150 can include a microprocessor with associated read only memory (ROM) and random access memory (RAM) interfaces thereto. The pre-compensation circuitry 170*a*, 170*b* can be composed of multiple sets of coordinating circuitry and can be integrated with the components described above or organized into a separate component of a disk drive. For example, the pre-compensation circuitry 170*a*, 170*b* can be integrated into the controllers 160, 180, the R/W channel circuitry 175, the preamp/writer 140, or various combinations of these components (e.g., the components 160, 170, 180 can all be combined into a single integrated circuit chip).

As shown, the drive electronics 150 can include the R/W channel processing circuitry 175. The R/W channel circuitry 175 can be implemented in a read/write channel transceiver device suitable for use in the HDD system. In some implementations, the R/W channel circuitry 175 is implemented on one or more integrated circuit (IC) devices. The read/write channel device can include additional circuitry and modules (not shown) according to some implementations, for example error correction circuitry, read signal circuitry, servo signal processing circuitry, and a write signal circuitry.

Further, the R/W channel circuitry 175 includes pre-compensation circuitry 170b, which is at least part of a set of coordinated circuitry that carry out the compensation techniques disclosed herein. The pre-compensation circuitry 170a, 170b can be implemented as circuitry and/or logic that generates, controls, or otherwise manipulates electrical signals relating to write controls, such as write-current. Additionally, the pre-compensation circuitry 170a, 170b can control characteristics (e.g., amplitude and phase) associated with the electrical signals. The pre-compensation circuitry 170b can generate the WCPC signal that is used to control compensation techniques described, such as employing the WCPC signal to adjust an overshoot write-current level (also referred to as the overshoot amplitude), and baseline write-current level. As discussed in more detail in reference to FIG. 2, a generated write-current signal can be set to multiple levels that are a function of the data pattern (e.g., NRZ signal) and the WCPC signal. The pre-compensation circuitry 170b can adjust the WCPC signal level to impact the write-current by coordinating with pre-compensation circuitry 170a in the pre-amp/writer 140 to generate the baseline write-current at a lower magnitude level when the WCPC signal is also low, and generate the baseline write-current at a greater magnitude level when the WCPC is also high.

In addition, the pre-compensation circuitry 170a, 170b can implement write pre-compensation (WPC) of data to be written onto the HDD, which involves shifting the rising and falling edges of the input data (phase shifting of the data signal) where both the rising and falling edges are shifted independently based on the data pattern. To obtain high density recording, magnetic transitions representing data patterns can be closely packed on the disk(s) 110. Each transition or absence of a transition of the recording bit sequence is located in a window in which a flux reversal may occur. Such closely packed data bits influence each other so that non-linear magnetic shifting of transitions and bit interference is likely to occur during write operations.

When the read/write head 132 is writing to a high density magnetic recording channel, it can be beneficial to adjust the position of transitions in the data stream to correct for the influence of nearby transitions so that transitions in the recovered data stream are evenly placed. Such pre-compensation of data being written to the disk(s) 110 can be accomplished by employing the pre-compensation circuitry 170a to change the timing of the magnetic flux reversal in a clock period to offset the magnetic transition shift and interference effects of adjacent and nearby bits. In this way, the transition shift of a bit due to the pattern of the preceding and/or succeeding bits is anticipated and the bit recording time is changed to compensate for the magnetic transition shift due to the effects of surrounding bits.

Pre-compensation techniques implemented by pre-compensation circuitry 170a can include offsetting a magnetic transition shift. The offset of the magnetic transition shift of a bit due to the pattern of preceding and/or succeeding bits can be anticipated and the bit recording time changed to compensate for the magnetic transition shift due to the effects of the surrounding bits. For additional details regarding known systems and techniques for write-current wave shaping to control the magnetic fields on a recording media, see Contreras, et. al., "Characterization of Write-Signal Efficiency Utilizing Write-Current Dynamic Wave-Shaping", IEEE TRANSACTIONS ON MAGNETICS, VOL. 53, NO. 2, FEBRUARY 2017, and U.S. Pat. No. 9,030,770 to Contreras, et. al., both of are hereby incorporated by reference in their entirety.

Figure 2:
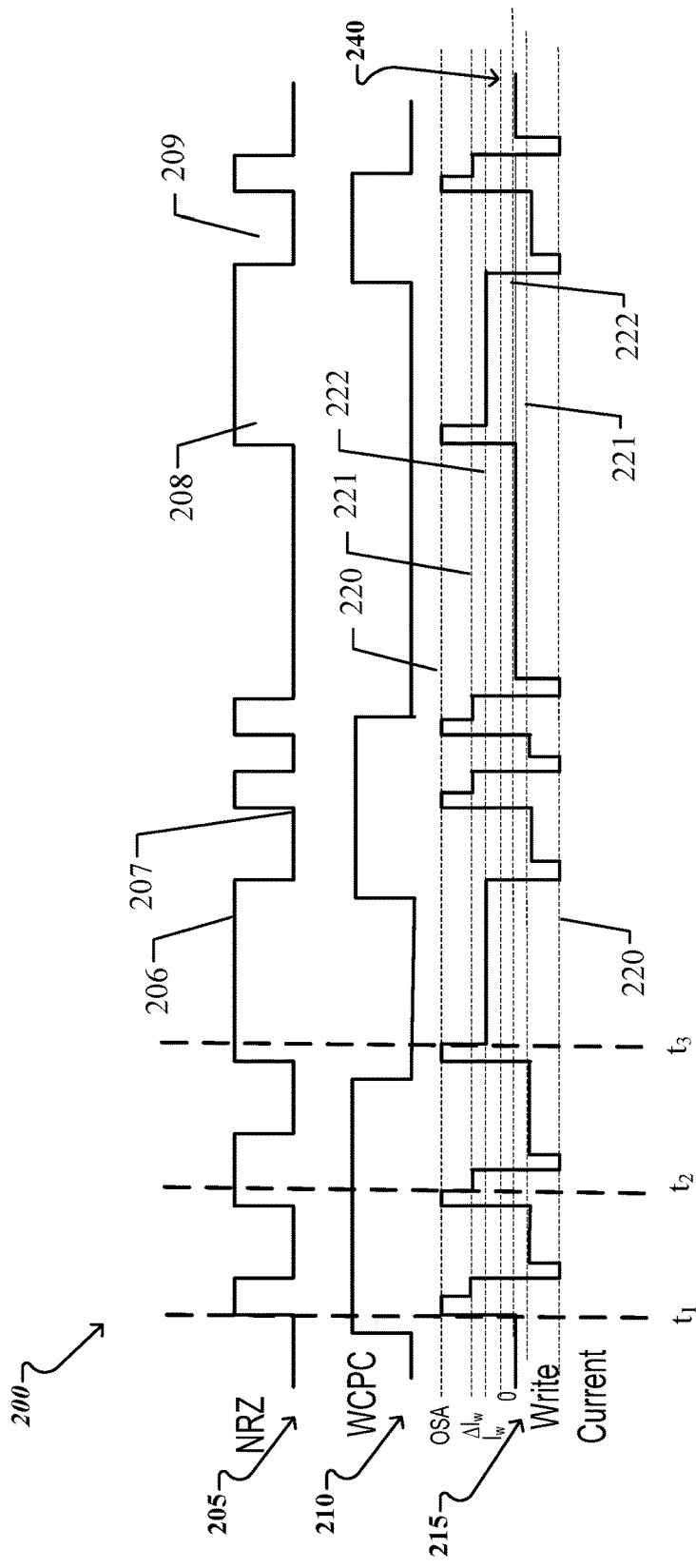
FIG. 2 shows a timing diagram including examples of non-return to zero (NRZ) signal, WCPC signal, and write-current signal waveforms as implemented according to a WCPC technique.

FIG. 2 shows a timing diagram 200 of examples of a NRZ signal 205, WCPC signal 210, and write-current signal 215 waveforms as implemented according to the disclosed WCPC technique. It should be appreciated that the amplitude levels for the electrical signals in FIG. 2-FIG. 3 can have magnitudes, or an absolute value for a level relating to the amplitude's distance from zero extending in both the positive direction and negative direction. For example, write-current signal 215 is shown as having negative current levels below the zero axis 240, and positive current levels above the zero axis 240. Thus, comparatively describing electrical signals hereinafter, for example greater and lower levels, can refer to magnitude values.

In general, the WCPC signal 210 and configurable aspects of the write-current signal 215, such as the write-current baseline level and an overshoot amplitude, can be described as write-current controls. Write-current controls can be adjusted by the disclosed compensation techniques. These write-current controls having been set for compensation, can then be applied by components of the HDA (shown in FIG. 1) to achieve the desired magnetic tracks on the recording medium. In some implementations, the WCPC signal 210 is generated by the R/W channel circuitry 175 and communicated to the pre-amp circuitry 142 (e.g., across a flexible printed cable) in order to generate the write-current signal 215 in response. In some cases, the write-current controls are determined using the compensation techniques and set prior to the write-data sequence. Furthermore, the write-current controls can be set between multiple write-data sequences writing to different sectors of the recoding medium.

The NRZ signal 205 can be used to represent a sequence of digital bits, or a data pattern, to be encoded on the magnetic recording medium. For example the NRZ signal 205 can be generated and employed during a write operation of a HDD. The NRZ signal 205 is shown as a binary signal having a rectangular pulse-amplitude modulation with levels associated with negative (−) and positive (+) polarities. Transitions to an alternating level (or the absence of a transition) of the NRZ signal 205 during a window can represent an individual coded bit. In referring to FIG. 2, the NRZ signal 205 is shown to have an amplitude that alternates between a high level (+ polarity) 206 and a low level (− polarity) at 207. Moreover, the NRZ signal 205 has multiple transitions 208, 209, as the signal rises or falls to reach the level of an alternate polarity. As an example, the NRZ signal 205 can represent a "1" at rising edges such as 208, where the signal transitions from low to reach a high level. Further, the NRZ signal 205 can represent a "0" at falling edges, where the signal drops from high to the lower level. For instance, falling edge 209 of NRZ signal 205 represents a "0".

FIG. 2 illustrates a write-current signal 215 as having multiple step-waves that generally begin with an overshoot at a polar transition (e.g., edge of the NRZ signal 205). The overshoot amplitude can be described as a substantially increased (or spike) level for the write-current signal 215. In starting with a large current, as produced by the overshoot amplitude, the writer can change polarities of the magnetic fields faster, thereby ensuring that the writer is set to the proper state needed for a sharp transition in encoding data.

After the initial overshoot, the amplitude of the write-current signal 215 can settle to a more stable baseline current level for the remainder of the period. In some cases, higher frequency data patterns can compensate for a slower head using an increased overshoot amplitude.

The writer and writer electronics have knowledge of the data pattern associated with the NRZ signal 205, before driving the read/write head to record the data. Accordingly, the compensation logic can adjust the write-current controls in a manner that considers the characteristics of the data pattern dictated by a NRZ signal 205. Compensation produces an electrical signal, namely write-current 215, which is converted into magnets on the recoding medium having more uniform width. Write-current compensation can involve generating the WCPC signal 210, and adjusting the write-current signal 215 as a function of the WCPC signal 215.

As illustrated in FIG. 2, the write-current signal 215 amplitude can be selectively set to three different levels. The diagram 200 includes an overshoot amplitude (OSA) level 220, a greater magnitude write-current baseline ($\Delta I_W$) level 221, and a lesser write-current baseline ($I_W$) level 222. In reference to positive current levels (e.g., above the zero axis 240), $\Delta I_W$ 221 having a greater magnitude is illustrated as higher than $I_W$ 222. In reference to negative current levels (e.g., below the zero axis 240), $\Delta I_W$ 221 having a greater magnitude is illustrated as lower than $I_W$ 222. Which level is selected for setting the write-current signal 215 amplitude is dictated, at least in part, by the WCPC signal 210. That is, when the WCPC signal 210 is high (WCPC=1), the baseline for the write-current signal 215 (after OSA) is set to $\Delta I_W$ level 221. Otherwise, if the WCPC signal 210 is low (WCPC=0), then the baseline for the write-current signal 215 (after OSA) is set to $I_W$ level 222. According to this implementation, a single OSA level 220 is applied to the write-controls. For example, the pre-compensation circuitry is configured to use the overshoot amplitude having the same magnitude for all polarity transitions of the write-current signal 215, regardless of the magnet length. Thus, as shown FIG. 2, OSA level 220 is used to set each current overshoot amplitude for the write-current 215 at the start of a transition to compensate for a potentially slow response of the head.

But after the overshoot level, a baseline level for the write-current will be used. An underlying concept relating to write-current compensation is that a higher baseline level of the write-current typically translates to larger magnetic fields (e.g., farther spread), and in turn forming wider magnets. Thus, to compensate for this phenomenon, the disclosed compensation techniques uses the WCPC signal 210 to set the baseline level for the write-current signal 215 to a lower level for longer magnets. Conversely, for shorter magnets, the WCPC signal 210 is used to set the baseline level for the write-current signal 215 to the higher level. In some implementations, an additional overshoot level can be used, which can be controlled by the pre-amp (e.g., internal pre-amp mode), rather than the WCPC mechanisms.

In the example of FIG. 2, at a time $t_1$ the NRZ signal 205 transitions (e.g., low to high), and the WCPC signal 210 is set to high (indicating a short magnet). At $t_1$, which is the start of changing the polarity of the signal, the write-current 215 is adjusted for overshoot, and set to OSA level 220. As illustrated, it should be appreciated that the WCPC signal 210 is set to its intended value slightly before a transition of the NRZ signal 205 occurs.

Moreover, as discussed in detail above, the data pattern that is intended to be recorded is known to the system before writing that data to the recoding medium. Based on the data pattern, the system can determine whether a long magnet or a short magnet is to be formed at a particular time. The WCPC signal 210, in turn, is set based on the known characteristics of an upcoming magnet, in order to perform the appropriate compensation. For instance, in the example illustrated in FIG. 2, time $t_2$ is shown as occurring during a subsequent pulse of the NRZ signal 205 for another short magnet. Also, $t_2$ is at a time after setting an initial overshoot for the write-current signal 215. At $t_2$ the write-current signal 215 is being lowered from its high OSA level 220 to a write-current baseline level that is selected according to the compensation techniques. Since the system can predetermine that a shorter magnet is expected at the time period relating to $t_2$ (which can also be indicated by the higher-frequency pulse for the NRZ signal 205 at $t_2$) the WCPC is set to high (WCPC=1), which causes the higher $\Delta I_W$ level 221 to be used to as the baseline write-current signal 215 after the OSA level 220.

Further, a time $t_3$ involves writing data to the recoding medium which is expected to form a longer magnet (which can also be indicated by the lower-frequency pulse for the NRZ signal 205 at $t_3$). In this case, the WCPC signal 210 is set to low (WCPC=0), in order to reduce the write-current baseline for this longer magnet. In this case, the WCPC signal 210 triggers use of the lower write-current baseline level $I_w$ 222, lowering the write-current to compensate for the longer magnet.

As mentioned above, the WCPC signal 210 is set before the NRZ signal 205 changes. Subsequent to encountering a transition in the NRZ signal 205, the WCPC signal 210 can be set to the same current value of the NRZ signal 205 at the transition point. Further, the write-current signal 215 can be latched to the NRZ signal 205 and the WCPC 215. In the case of latching, the write-current signal 215 is latched to the WCPC signal 210 and the NRZ signal 205. If the WCPC signal 210 is changed, for example in the middle of a long magnet, the corresponding change in the write-current signal 215 will not be triggered until the next transition point of the NRZ signal 205. Restated, the pre-compensation circuitry is configured to select the baseline level for the write-current signal 215, based on the value of the WCPC signal 210 and at a time of transition of the NRZ signal 205. In some cases, the pre-amp, which adjust the write-current signal 215 overshoot and baseline levels, is not designed to include an internal clock. To this end, latching the write-current signal 215 to the other signal can be advantageous to drive the write-current at the pre-amp. For example, the NRZ signal 205 is not required to be synchronous, and thus employable in an asynchronous transmission environment, for instance without an explicit clock signal involved. Because of this, a time of transition of the NRZ signal 205 can trigger the pre-amp to adjust the write-current signal 215 level, without an internal clock signal. Also, the implementation shown in FIG. 2 can realize the advantage of a straightforward design on the read-data channel (RDC) side. In other implementations, a more robust pre-amp having an internal clock can be used in the HDD system, which can lend itself to potentially more advanced processing, such as having more than two baseline current levels.

Figure 3:
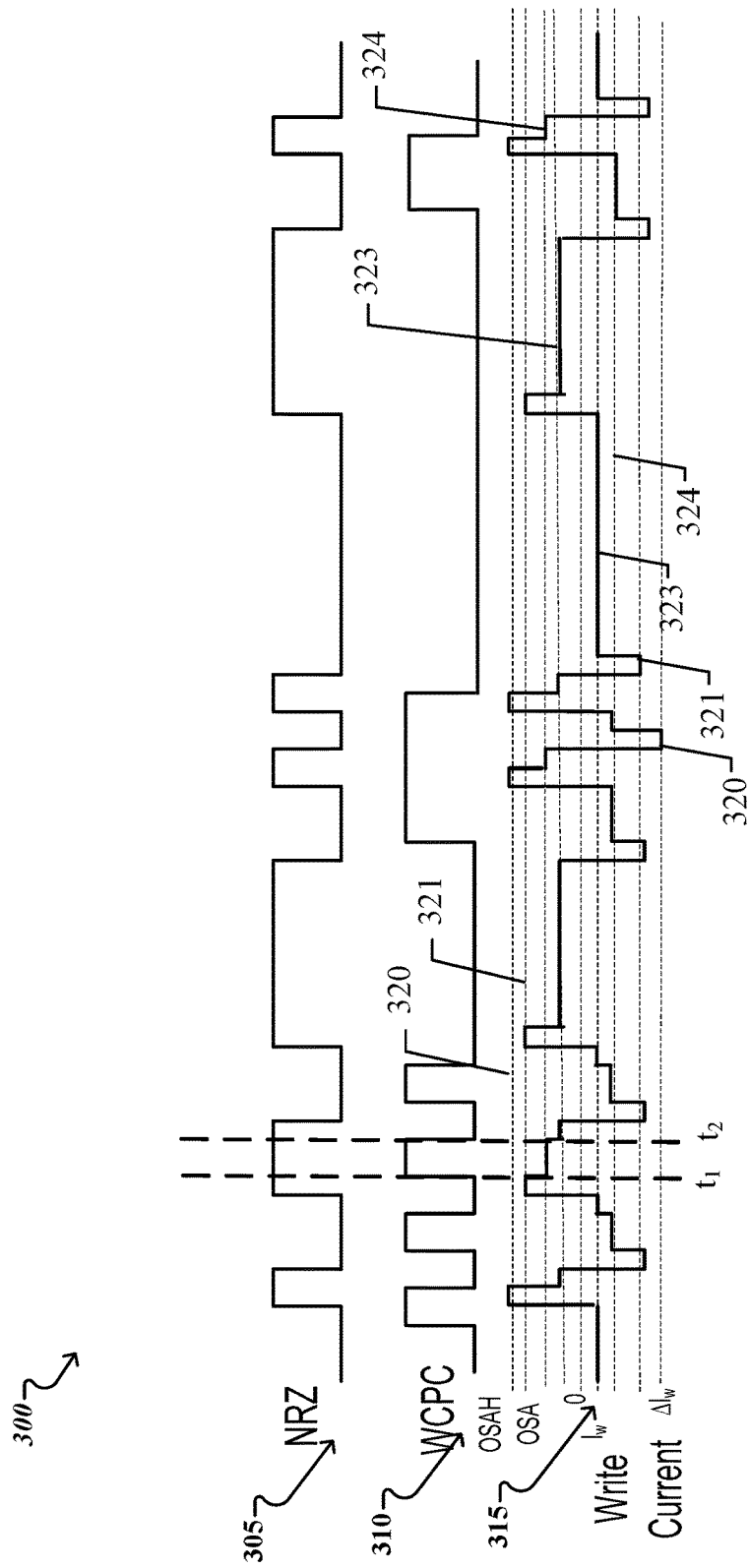
FIG. 3 shows a timing diagram including examples of NRZ signal, WCPC signal, and write-current signal waveforms as implemented according to another WCPC technique.

FIG. 3 shows a timing diagram 300 including examples of NRZ signal 305, WCPC signal 310, and write-current signal 315 waveforms as implemented according to another WCPC technique. In general, the compensation technique shown in FIG. 3 is similar to that shown in FIG. 2. However, in reference to FIG. 3, the WCPC signal 315 is used to determine multiple overshoot amplitude levels that are applicable to the write-current controls, in addition to the write-current baseline levels. Accordingly, diagram 300 illustrates four different write-current levels that can be applied by the compensation techniques to control the write-current signal 315.

FIG. 3 shows examples of the multiple overshoot levels, including an overshoot amplitude high (OSAH) level 320, and an overshoot amplitude (OSA) level 321. Additionally, the higher $\Delta I_W$ level 324, and the lower $I_W$ level 323 are shown. The level that is used for setting the write-current signal 215 from amongst the four levels available is dictated, at least in part, by the WCPC signal 310. According to this implementation, when the WCPC signal 310 is high (WCPC=1) at a transition of the NRZ signal, then the OSAH level 320 is used. Otherwise, OSA level 321 is used. As previously discussed, the WCPC signal 310 set to high can be indicative of a short magnet. Therefore, the technique further compensates for short magnets by increasing the overshoot amplitude of the write-current signal 315 (by using OSAH level).

The implementation of FIG. 3 selects the write-current baseline level for the write-current signal 315 in a manner similar to that discussed in reference to FIG. 2. For example, this implementation involves latching at the pre-amp on the NRZ signal 305 and the WCPC signal 310 from the R/W channel. However, the WCPC signal 310 also accounts for the overshoot. For example, if a large overshoot is desirable for a next transition of the NRZ signal 305, the WCPC signal 310 signal is set high. As a consequence, it its possible for the WCPC signal 315 to change prior to the next successive transition in the NRZ signal 305, which then triggers the write-current signal 315 to switch baseline levels (e.g., the write-current signal 315 does not maintain the initially set baseline level for the duration of the period).

Implementing the multiple levels for both the overshoot write-current level, and the baseline write-current level can realize advantages associated with using a more complicated write-control scheme (e.g., improved overall performance of the writer). Nonetheless, there are design tradeoffs associated with this more complex logical implementation. For example, in FIG. 3, at a time $t_1$ occurring after the initial overshoot for the pulse of write-current signal 315, the WCPC signal 310 switches to high. Accordingly, the write-current signal 315 is set to the higher of the baseline levels, $\Delta I_W$ level 324. However, this initial baseline level set for the write-current 315 is lost at time $t_2$. At a time $t_2$, the WCPC signal 310 switches to low, causing the amplitude of the write-current signal 315 to accordingly drop down to the lower baseline level, $I_W$ 323. It should be appreciated that these unintended shifts in the signal level for the write-current signal 315 will not negatively impact the overall performance of the write-current pre-compensation techniques of FIG. 3.

Figure 4:
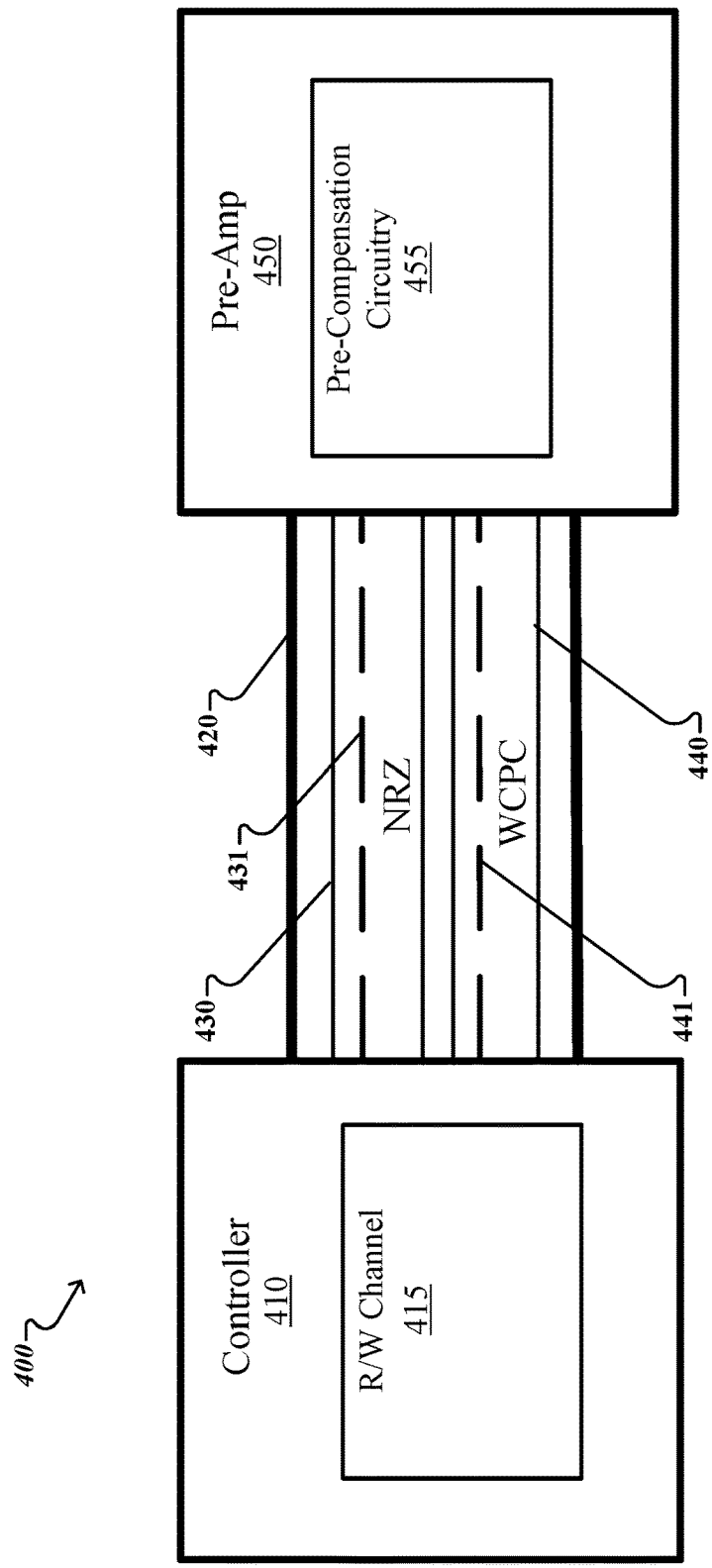
FIG. 4 shows an example of an apparatus including a controller, pre-amp and channel interface for implementing the WCPC techniques.

FIG. 4 shows an example of an apparatus 400 including a controller 410, pre-amp 450 and channel interface 420 for implementing the WCPC techniques. The apparatus 400 can be a magnetic-medium-based storage device, such as the HDD discussed above in reference to FIG. 1. As shown in FIG. 4, the controller 410 includes a R/W channel 415, where the controller 410 can be one or more IC chips (e.g., a combo chip or system on chip (SOC)). Also, the pre-compensation circuitry 455 is shown to be included in the pre-amp 450.

In some implementations, the pre-amp 450 can be implemented on a structure or device within the apparatus 400 that is physically separate from the controller 410, such as on a separate IC chip. Thus, a physical connector can be used as an interface between the components implementing the controller 410 and the pre-amp 450. FIG. 4 shows that the apparatus includes an interface cable 420 supporting the transmission of electrical signals used in the pre-compensation techniques between the R/W controller 410 and the pre-amp 450. The interface cable 420 can be a flexible printed cable, or any physical connector providing a board-to-board or chip-to-chip interconnection in high-density electronic applications that may be deemed necessary and/or appropriate. The interface cable 240 includes at least two distinct signal pathways 430, 440. As shown, signal pathway 440 is used to carry the write-control signal generated by the R/W channel 415, namely the WCPC signal 441, to the pre-amp 450. Additionally, signal pathway 430 carries the data signal, namely the NRZ signal 431 to the pre-amp 450. After the pre-amp 450 receives the WCPC signal 441 and the NRZ signal 431, it can perform the pre-compensation techniques disclosed herein. It should be appreciated that pre-compensation techniques utilize a logic that can support the signals and controls necessary to achieve pre-compensation and improved write-current control over a legacy interface, such as a flexible printed cable.

Moreover, the apparatus 400 can be configured to use an interface cable 420 having a predefined number of pathways, which can be scaled to number of control signals used by the pre-compensation techniques. For example, in order to implement a pre-compensation technique having a greater complexity, the corresponding logic can be arranged to use additional electrical signals, such as multiple WCPC signals. The use of additional signals potentially provides greater control capabilities (e.g., synchronization, additional baseline levels) that can improve pre-compensation and, in turn, the overall performance of the writer. In this case, the interface cable 420 can also be configured to provide the number of pathways needed for the number of electrical signals used for pre-compensation. As a result, the interface cable 420 can have a complexity of design that meets the signaling specifications of the particular pre-compensation technique used in the HDD system.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including system on chip (SOC) implementations, which can include one or more controllers and embedded code.

While this specification contains many specifics, these should not be construed as limitations on the scope of what may be claimed, but rather as descriptions of features that may be specific to particular implementations. Certain features that are described in this specification in the context of separate implementations can also be configured in combination in a single implementation. Conversely, various features that are described in the context of a single implementation can also be configured in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described above should not be understood as requiring such separation in all implementations.

Other implementations fall within the scope of the following claims.

What is claimed is:

1. An apparatus comprising:
a controller configured to generate a data signal and a write-current control signal for writing data to a magnetic medium of a data storage device as a sequence of magnets formed in the magnetic medium of the data storage device; and
pre-compensation circuitry coupled with the controller to receive the data signal and the write-current control signal and to generate a write-current signal to effect the writing of the data to the magnetic medium based on the data signal and the write-current control signal;
wherein the pre-compensation circuitry is configured to use different baseline write-current levels for the write-current signal after an overshoot write-current level used at polarity transitions of the write-current signal, and the pre-compensation circuitry is configured use a first baseline level of the different baseline write-current levels for a first type of magnet in the sequence of magnets and use a second baseline level of the different baseline write-current levels for a second type of magnet in the sequence of magnets, the first baseline level having a greater magnitude than the second baseline level, and the first type of magnet being shorter than the second type of magnet.

2. The apparatus of claim 1, wherein the pre-compensation circuitry is configured to use the overshoot write-current level having a same magnitude of overshoot at all polarity transitions of the write-current signal, regardless of magnet length.

3. The apparatus of claim 2, wherein the controller comprises a read/write channel included in a system on chip (SOC) comprising the controller, the pre-compensation circuitry is included in a pre-amplifier for the data storage device, and the apparatus comprises an interface cable having a predefined number of signal pathways comprising:
a write-current pre-compensation (WCPC) signal pathway to carry the write-current control signal being a WCPC signal; and
a non-return to zero (NRZ) signal pathway to carry the data signal being an NRZ signal.

4. The apparatus of claim 3, wherein the pre-compensation circuitry is configured to select between the first and second baseline levels in accordance with a value of the WCPC signal at a time of transition of the NRZ signal.

5. The apparatus of claim 1, wherein the pre-compensation circuitry is configured to use a first overshoot write-current level at polarity transitions of the write-current signal corresponding to magnets of the first type, and use a second overshoot write-current level at polarity transitions of the write-current signal corresponding to magnets of the second type, the first overshoot write-current level having a greater magnitude than the second overshoot write-current level.

6. The apparatus of claim 5, wherein the controller comprises a read/write channel included in a system on chip (SOC) comprising the controller, the pre-compensation circuitry is included in a pre-amplifier for the data storage device, and the apparatus comprises an interface cable having a predefined number of signal pathways comprising:
a write-current pre-compensation (WCPC) signal pathway to carry the write-current control signal being a WCPC signal; and
a non-return to zero (NRZ) signal pathway to carry the data signal being an NRZ signal.

7. The apparatus of claim 6, wherein the predefined number of signal pathways further comprise a write pre-compensation (WPC) signal pathway to carry a WPC signal, and the pre-compensation circuitry is configured to adjust edges of the polarity transitions based on the WPC signal.

8. The apparatus of claim 7, wherein the WCPC signal is a binary signal, and the pre-compensation circuitry is configured to (i) select between the first and second overshoot write-current levels in accordance with a value of the binary WCPC signal at a time of transition of the NRZ signal, and (ii) transition from the first baseline level to the second baseline level at a time of transition of the binary WCPC signal.

9. A disk drive system, comprising:
at least one magnetic media disk;
a read/write head configured and arranged to write data to the magnetic media disk as a sequence of magnets formed in the magnetic media disk;
pre-compensation circuitry coupled with the read/write head and configured to generate a write-current signal to effect writing of the data by the read/write head based on a data signal and a write-current control signal; and
a controller coupled with the pre-compensation circuitry and configured to generate the data signal and the write-current control signal;
wherein the pre-compensation circuitry is configured to use different baseline write-current levels for the write-current signal after an overshoot write-current level used at polarity transitions of the write-current signal, and the pre-compensation circuitry is configured use a first baseline level of the different baseline write-current levels for a first type of magnet in the sequence of magnets and use a second baseline level of the different baseline write-current levels for a second type of magnet in the sequence of magnets, the first baseline level having a greater magnitude than the second baseline level, and the first type of magnet being shorter than the second type of magnet.

10. The disk drive system of claim 9, wherein the pre-compensation circuitry is configured to use the overshoot write-current level having a same magnitude of overshoot at all polarity transitions of the write-current signal, regardless of magnet length.

11. The disk drive system of claim 10, comprising:
a pre-amplifier, wherein the pre-amplifier includes the pre-compensation circuitry;
an interface cable coupling the controller and the pre-amplifier, wherein the interface cable includes a predefined number of signal pathways comprising:
a write-current pre-compensation (WCPC) signal pathway to carry the write-control signal being a WCPC signal; and
a non-return to zero (NRZ) signal pathway to carry the data signal being an NRZ signal; and
wherein the controller comprises a read/write channel included in a system on chip (SOC) comprising the controller.

12. The disk drive of claim 11, wherein the pre-compensation circuitry is configured to select between the first and second baseline levels in accordance with a value of the WCPC signal at a time of transition of the NRZ signal.

13. The disk drive of claim 11, wherein the predefined number of signal pathways further comprise a write pre-compensation (WPC) signal pathway to carry a WPC signal, and the pre-compensation circuitry is configured to adjust edges of the polarity transitions based on the WPC signal.

14. The disk drive of claim 9, wherein the pre-compensation circuitry is configured to use a first overshoot write-current level at polarity transitions of the write-current signal corresponding to magnets of the first type, and use a second overshoot write-current level at polarity transitions of the write-current signal corresponding to magnets of the second type, the first overshoot write-current level having a greater magnitude than the second overshoot write-current level.

\* \* \* \* \*